United States Patent
Vadipour

(10) Patent No.: US 7,436,336 B2
(45) Date of Patent: Oct. 14, 2008

(54) ANALOG DIGITAL CONVERTER (ADC) HAVING IMPROVED STABILITY AND SIGNAL TO NOISE RATIO (SNR)

(75) Inventor: Morteza Vadipour, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/613,185

(22) Filed: Dec. 19, 2006

(65) Prior Publication Data

US 2008/0143567 A1    Jun. 19, 2008

(51) Int. Cl.
*H03M 3/00* (2006.01)

(52) U.S. Cl. .................. 341/143; 341/118; 341/120; 341/155

(58) Field of Classification Search .............. 341/143, 341/118, 155, 341, 120
See application file for complete search history.

(56) References Cited

U.S. PATENT DOCUMENTS

| | | | | |
|---|---|---|---|---|
| 6,404,368 | B1 * | 6/2002 | Yamaguchi | 341/143 |
| 6,697,000 | B2 * | 2/2004 | LeReverend et al. | 341/143 |
| 6,940,436 | B2 * | 9/2005 | Hezar et al. | 341/143 |
| 7,123,177 | B2 * | 10/2006 | Cheng et al. | 341/143 |
| 2003/0169193 | A1 * | 9/2003 | LeReverend et al. | 341/143 |
| 2006/0164270 | A1 * | 7/2006 | Miller et al. | 341/143 |
| 2007/0139240 | A1 * | 6/2007 | Mitteregger et al. | 341/143 |
| 2007/0171109 | A1 * | 7/2007 | Mitteregger | 341/143 |
| 2007/0188362 | A1 * | 8/2007 | Doerrer et al. | 341/143 |

* cited by examiner

*Primary Examiner*—Linh V Nguyen
(74) *Attorney, Agent, or Firm*—Garlick Harrison & Markison; Kevin L. Smith

(57) ABSTRACT

A sigma delta ($\Sigma\Delta$) analog to digital converter (ADC) that compensates for the adverse effects associated with the time delay introduced by delay circuitry of the feedback loop. This $\Sigma\Delta$ ADC includes a first summing stage, first integrator, second summing stage, second integrator, quantizer, and feedback loop. The second integrator has associated with it a feed forward pass operable to reduce negative effects of delay circuitry within the feed back loop. Feedback loop includes delay circuitry and a number of digital to analog converters. The feed forward path that reduces the effects of the delay includes a resistance within the second or additional integrator. This allows the adverse effects of the time delays associated, which may lead to circuit instability or meta-stability, to be reduced or eliminated.

18 Claims, 8 Drawing Sheets

ANALOG DIGITAL CONVERTER (ADC) HAVING IMPROVED STABILITY AND SIGNAL TO NOISE RATIO (SNR)

TECHNICAL FIELD OF THE INVENTION

The present invention relates generally to analog to digital converters (ADCs), and more particularly to improving the signal to noise ratio (SNR) and stability of ADC's.

BACKGROUND OF THE INVENTION

The explosive growth in the demand for portable, battery-operated electronics for communications, computing, and other consumer or mobile applications demands analog to digital converters (ADCs) for such portable devices that feature low power dissipation, low cost, and high reliability. The process of converting an analog signal to a digital signal often limits the speed and resolution of the overall system. As a result development efforts often focus on the need for improved ADCs that can achieve both high speed and high resolution.

Sigma Delta ($\Sigma\Delta$) ADCs are well-suited and used in instrumentation, voice and audio applications. $\Sigma\Delta$ ADCs feature both low frequency and high resolution. The high resolution of $\Sigma\Delta$ architecture is obtained through trading off the speed of modern integrated circuit technology for high accuracy. As integrated circuit (IC) technology continues to be scaled down, this technology provides ever increasing operation speeds thus allowing $\Sigma\Delta$ ADCs to operate at higher and higher frequencies.

The large need for wireless and Internet applications are to a great degree driving the need for improved $\Sigma\Delta$ ADCs. ADC converters provide an irreplaceable link between analog transducers and digital signal processing systems. ADCs are the key component used to translate an analog signal to a digital representation. Thus, ADCs facilitate the processing of data in a digital environment. Further IC technologies have made possible the ability to perform many signal processing functions in the digital domain rather than the analog domain. This ability places an even greater importance on ADCs that can be integrated within IC fabrication technologies to produce optimized digital circuits and systems.

SUMMARY OF THE INVENTION

Embodiments of the present invention are directed to systems and methods that are further described in the following description and claims. Advantages and features of embodiments of the present invention may become apparent from the description, accompanying drawings and claims.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Figure 1:
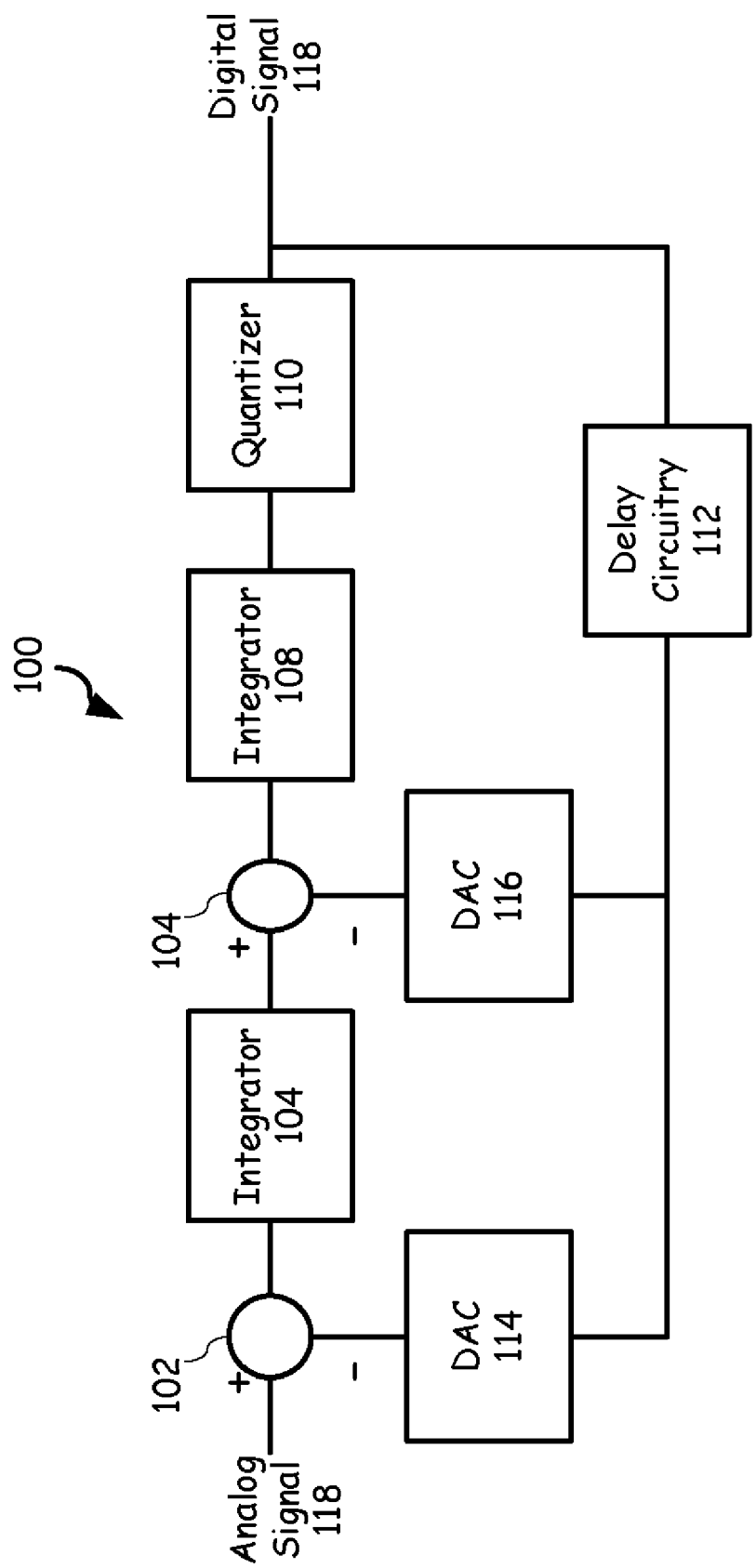
FIG. 1 depicts a typical second order continuous time sigma delta ($\Sigma\Delta$) analog to digital converter (ADC)

Preferred embodiments of the present invention are illustrated in the FIGS., like numerals being used to refer to like and corresponding parts of the various drawings.

Sigma Delta ($\Sigma\Delta$) analog to digital converters (ADCs) are well-suited and used within instrumentation, voice and audio applications. $\Sigma\Delta$ ADCs feature both low frequency and high resolution. Additionally $\Sigma\Delta$ ADC reduce the requirement on the number, precision, and complexity of analog circuits by facilitating signal processing in the digital domain. This advantage is important particularly in low voltage applications where digital processing can occur where the power requirements are dramatically reduced by scaling technologies.

The standard architecture of a $\Sigma\Delta$ ARC includes one or more integrators, one quantizer and a feedback loop having one or more digital to analog converters (DACs).

Two types of $\Sigma\Delta$ ARCs are typically used. These are the discrete time and continuous time. Embodiments of the present invention utilize a continuous time. This has several advantages in both power and speed. In general a $\Sigma\Delta$ ADC receives an analog signal and processes the analog signal to create a digital representation of the analog signal.

A problem associated with the $\Sigma\Delta$ ADC is the quantizer within the feedback loop. The quantizer transforms the analog signal to a digital format. The quantizer cannot perfectly resolve an analog signal to digital without delay. This is particularly true where a small input signal is received. In these cases, the quantizer cannot resolve the analog signal to digital voltage levels perfectly. Time (i.e. a delay) is required to resolve the small analog signal into an accurate digital signal. For large analog signals the delay may be small. However for small analog signals the delay may be relatively large. This creates a variable delay that depends on the analog signal. Longer delays may reduce SNR and may cause instability. This is referred to as the meta-stability of the quantizer.

In a continuous time $\Sigma\Delta$ ADC, meta-stability and variable delay of the quantizer could severely degrade the SNR performance. Traditionally an extra fixed delay has been allocated to the quantizer to provide sufficient time to resolve the meta-stability and prevent variation in delay. However, a major drawback of this technique is the potential instability of the loop due to the extra delay as is evident from feedback theory. Additionally, even if the loop might still be stable, the optimal Noise Transfer Function (NTF) is lost resulting in inferior SNR performance. In general less stable loops provide low SNR values.

Embodiments of the present invention compensate for or counteract the instability effects of this extra delay by introducing a zero in the feed forward path of the ADC. This allows the realization of very stable loops with optimal NTF and high SNR values. Another aspect of these embodiments is the simplicity of implementation of this technique which requires only a simple resistor without consuming any extra power.

Embodiments of the present invention provide a fixed delay time to the quantizer. The quantizer is provided a fixed delay in order to resolve the signal. At the same time, to counteract the effects of this delay, a zero time delay is created in the transfer function of the feed forward path. That zero cancels the adverse effects of the fixed delay required to resolve the signal. This arrangement also allows digital processing to occur within the feedback loop. This digital processing may be used to address non-linearities associated with the DACs. This digital processing between the quantizer and the DACs may be used to perform dynamic mismatch shaping. This digital processing requires a delay, such as the fixed delay whose negative effects are counteracted by the feed forward loop. Counteracting this delay improves stability and raises SNR to almost theoretical levels. This improved stability and improved SNR performance results by placing an appropriate resistance or impedance in a second order ΣΔ ADC's second integrator.

The standard architecture of a second order ΣΔ ADC includes two integrators, one quantizer, and a feedback loop having one or more digital to analog converters. FIG. 1 depicts a typical second order continuous time ΣΔ ADC 100. Second order continuous time ΣΔ ADC 100 includes a first summing stage 102, first integrator 104, second summing stage 106, second integrator 108, quantizer 110, fixed delay circuitry 112, and digital to analog converters (DACs) 114 and 116.

The input to each integrator stage i.e. integrator 104 and integrator 108 is the difference between the prior integrator's output and the DAC's output. The first stage integrator 104 input is the difference between the analog signal and the output of the first DAC.

Figure 2:
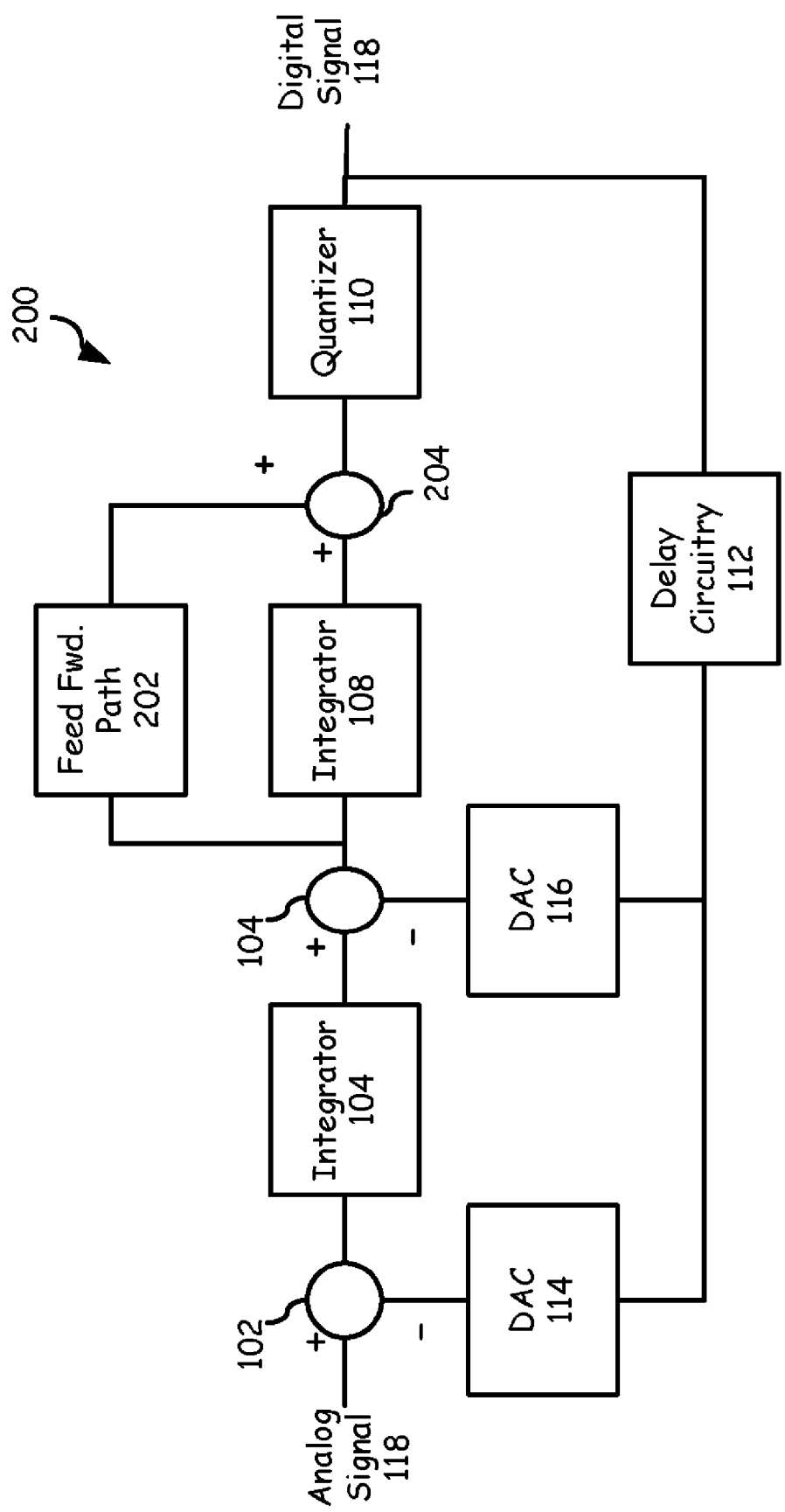
FIG. 2 depicts a second order continuous time $\Sigma\Delta$ ADC in accordance with embodiments of the present invention.

FIG. 2 depicts a second order continuous time ΣΔ ADC 200 in accordance with embodiments of the present invention. Second order continuous time ΣΔ ADC 200 includes a first summing stage 102, first Integrator 104, section summing stage 106, second integrator 108, quantizer 110, delay circuitry 112, and DACs 114 and 116. These components were all described previously with respect to FIG. 1. Additionally, ΣΔ ADC 200 includes a feed-forward path 202 and summing stage 204. This feed-forward path 202 creates a zero that may be used to negate or lessen adverse effects associated the fixed delay within the feedback loop. Addressing this issue may simply involve the addition of a resistance within the second integrator where properly choosing the resistance value allows the adverse effects associated with the fixed delay to be canceled.

Figure 3:
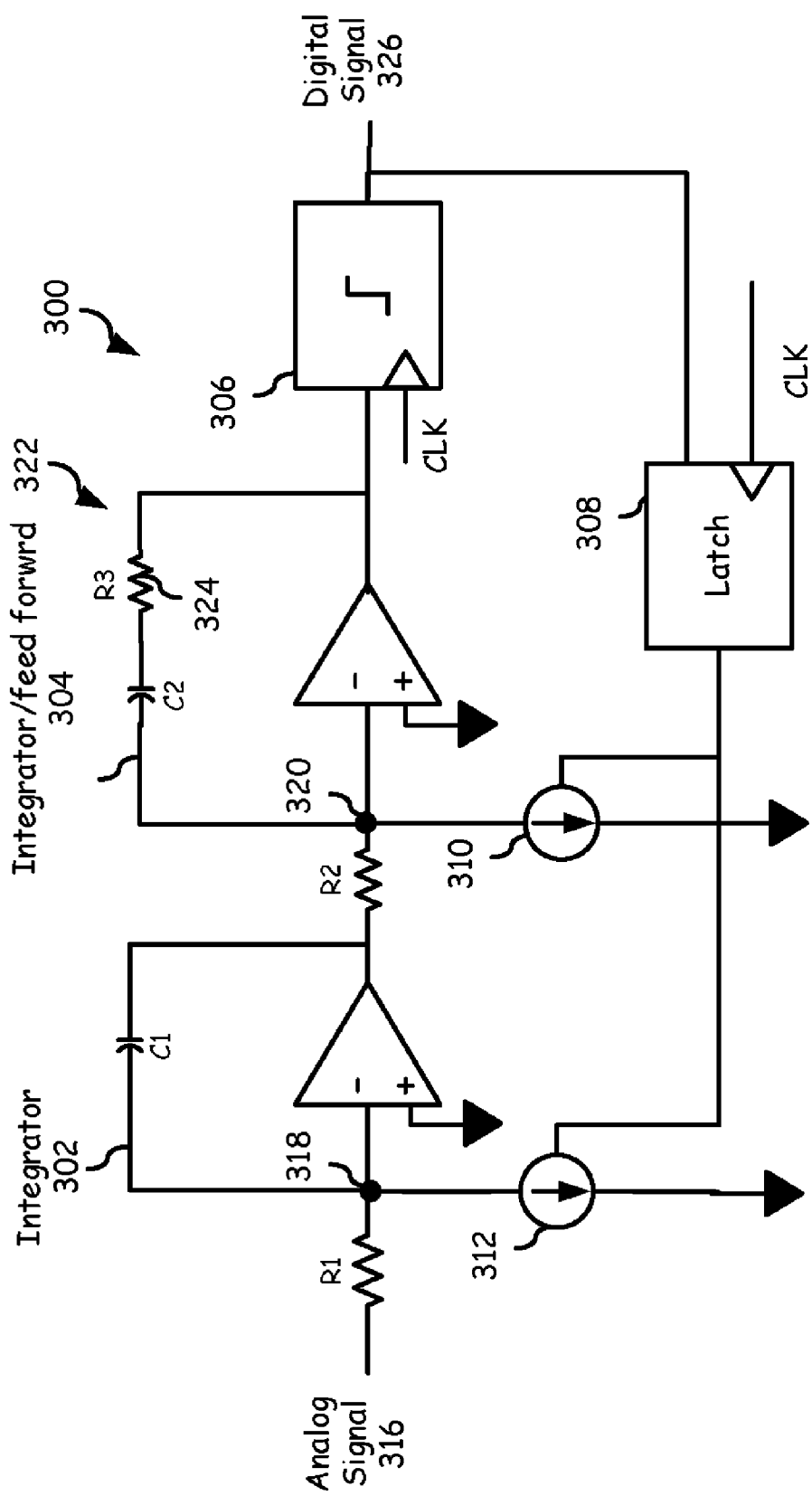
FIG. 3 provides a circuit schematic of a $\Sigma\Delta$ ARC in accordance with embodiments of the present invention.

FIG. 3 provides a schematic of a circuit schematic of a ΣΔ ADO in accordance with embodiments of the present invention. This schematic includes a first integrator 302, a second integrator/feed-forward 304, quantizer 306, fixed-delay circuitry 308, and DACs 310 and 312. An analog-voltage signal 316 is received at input node 318 of integrator 308. Analog-voltage signal 316 combines with an output of DAC 312. The difference between the output of DAC 310 and integrator 302 provides the input to Integrator 304 at node 320. feed forward is achieved by including resistor 324 in series with capacitor C2. Proper selection of the value of this resistor creates a zero that allows the negative effects of the fixed delay to be reduced or eliminated.

Embodiments of the present invention provide a significant advantage by eliminating the adverse effects of the delay circuitry by incorporating resistance with an appropriate value within the feed-forward path 322. The output of Integrator 302 is supplied to quantizer or comparator 306 wherein the digital output 326 is provided to latch 308 within feedback loop 326 as well as being made available externally. This is an example of one-circuit implementation for single-bit operation.

Figure 4:
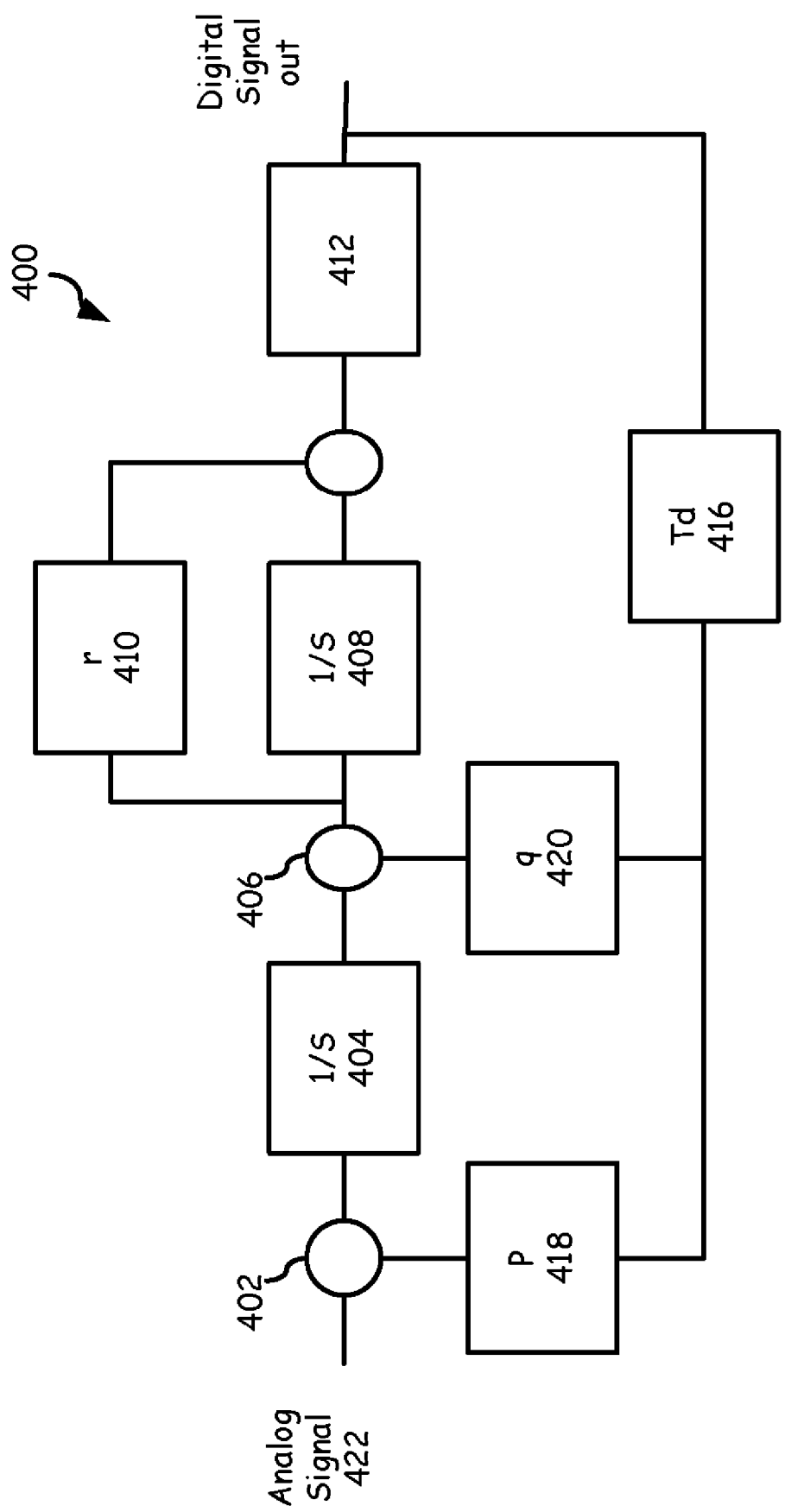
FIG. 4 provides a functional block diagram of a $\Sigma\Delta$ ADC in accordance with embodiments of the present invention.

The standard architecture of a ΣΔ ADC allows an analog signal 118 of FIGS. 1 and 2 or voltage 422 of FIG. 4 and 316 of FIG. 3 to he sampled at a high frequency and a high-speed, low-resolution digital signal is generated at the output of the ΣΔ ADC. This digital output may be processed in the digital domain to produce a high-resolution digital output. This efficient method of trading off speed for resolution in a ΣΔ technique is based on two concepts, over sampling and noise shaping. Over sampling reduces the quantization noise power in the signal hand by spreading a fixed quantization noise power over a bandwidth that is much larger than the signal band while noise shaping further attenuates this noise in the signal band and amplifies it outside the signal band. Using the feedback signal or feedback loop noise shaping in a ΣΔ ADC increases base-hand SNR by attenuating quantization noise at low frequencies.

The dynamic range of a ΣΔ ADC can We increased by increasing the over-sampling ratio (OSR) and order of the feedback loop. Modifying the OS does not influence the circuit design itself while increasing the order simply means adding another integrator while keeping the same circuit configuration. Since a conversion rate can be traded off directly for resolution through digital decimation, the converter specifications can be customized for the required application without changing the analog circuitry. By using single-bit quantization within the feedback loop a ΣΔ ADC loops low distortion and high linearity conversation in that an in-loop one-bit PAC only has two output values.

Continuous time modulators are much faster and provide a certain amount of anti-alias filtering, but are more sensitive to clock-phase noise because clock jitter may modulate noise and signal power in continuous time loops. They are the preferred choice in modern designs as better clock sources are more available.

FIG. 4 provides another depiction of a ΣΔ ARC 400 in accordance with embodiments of the present invention. ΣΔ ADC 400 includes summing Stage 402, first integrator Stage 404, second summing Stage 406, second integrator 408, feed forward path 410, quantizer 412, and a feedback loop 414 that includes a time delay module 416 and DACs 418 and 420. An analog input signal 422 is combined with the digital signal from DAC 418 within the feedback loop. The difference of the analog signal and digital signal is the input to first integrator 404. The output of integrator 404 is combined with the digital signal from DAC 420 to produce difference signal used as the input to second integrator 408. It is important that appropriate coefficients p, q, r, and $t_d$ be selected. A good noise transfer function (NTF) in ΣΔ converters is an FIR response. In case of a second order ΣΔ ADC this noise NTF may be defined by:

$$NTF = (1 - z^{-1})^2 \quad \text{(Equation 1).}$$

The time delay created by the capacitor and resistor shown in the feed forward path of FIG. 3 produce a time constant which then may be used to match the time delay, i.e., fixed time delay associated with the delay circuitry. In frequency domain, the zero created by the feedback path of FIG. 3 could be used to cancel the adverse effects of the fixed time delay $(T_d)$. The frequency of the zero is given by $$f_z = -\tfrac{1}{2}\pi\,(R_3 C_2) \quad \text{(Equation 2).}$$

The value of the time delay $(T_d)$ may he anywhere between zero and one clock period. One good value for a fixed delay is half a clock period (T/2). This choice for amount of time delay allows enough time for regeneration of comparators and is relatively easy to implement. For example, the time delay circuitry may be implemented as an extra latch 308 as shown within FIG. 3. With this assumption and normalized values chosen for p=1, $T_d$=0.5, the values for q and r may be given as follows:

$$q=1+1/(2\sqrt{2}) \quad \text{(Equation 3)}$$

$$r=1-1/(2\sqrt{2}) \quad \text{(Equation 4)}$$

This is just an example and various forms of an NTF and various values of the time delay may be selected which would result in different loop parameters p, q and r.

Returning to FIGS. 3 and 4, the location of the zero creating path r is uniquely in the second integrator and not the first integrator. This along with p, g and $t_d$ allows exact implementation of all useful NTF forms. In addition, as the zero creating parameter is realized by a resistor in series with a capacitor as shown in FIG. 3, its thermal noise contribution would be minimal when used within the second integrator.

Figure 5:
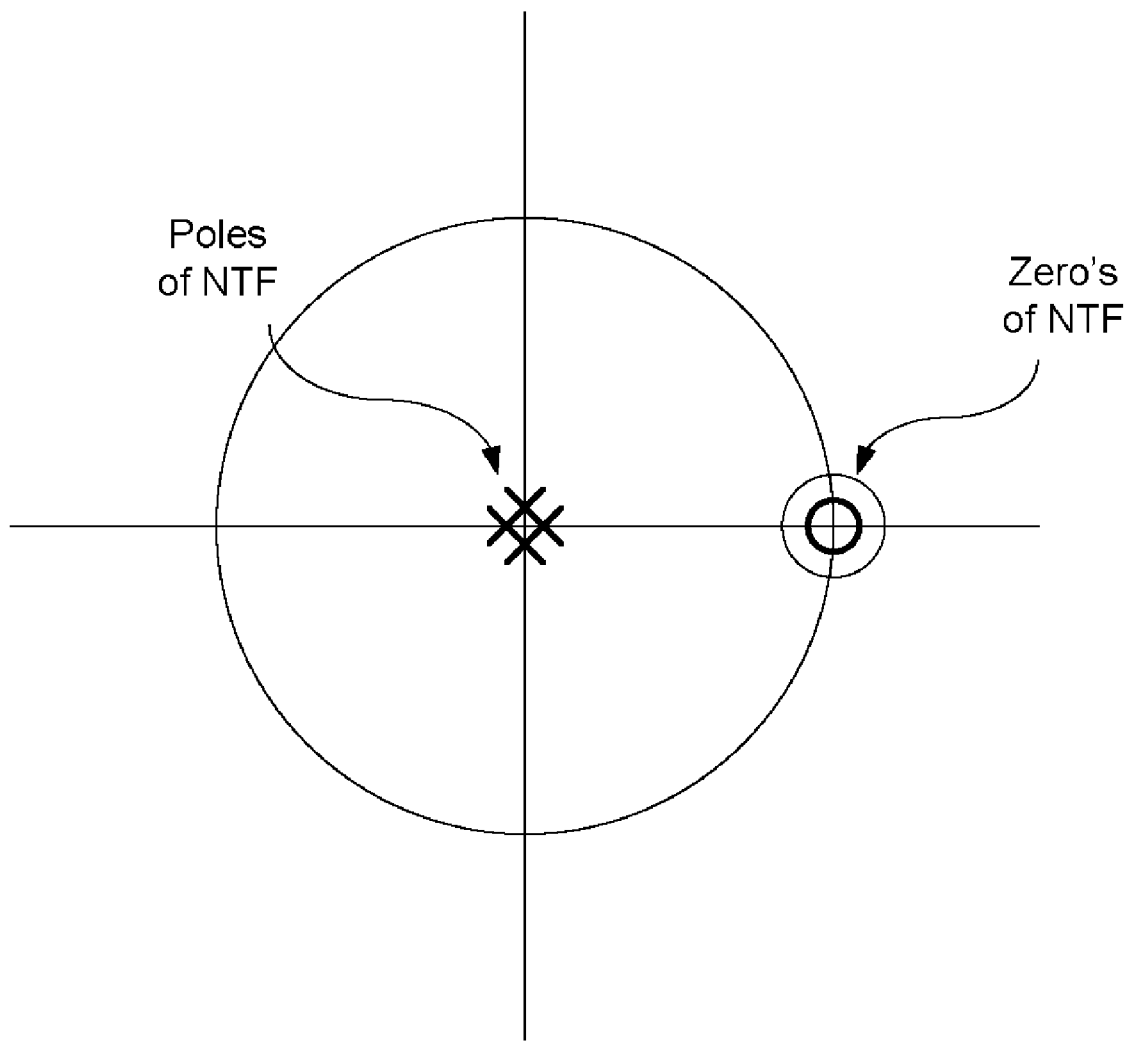
FIG. 5. provides a graph in the frequency domain for Noise Transfer Function where all zeros are on X=1, Y=0 and all poles are located on origin (X=0, Y=0)
Figure 6:
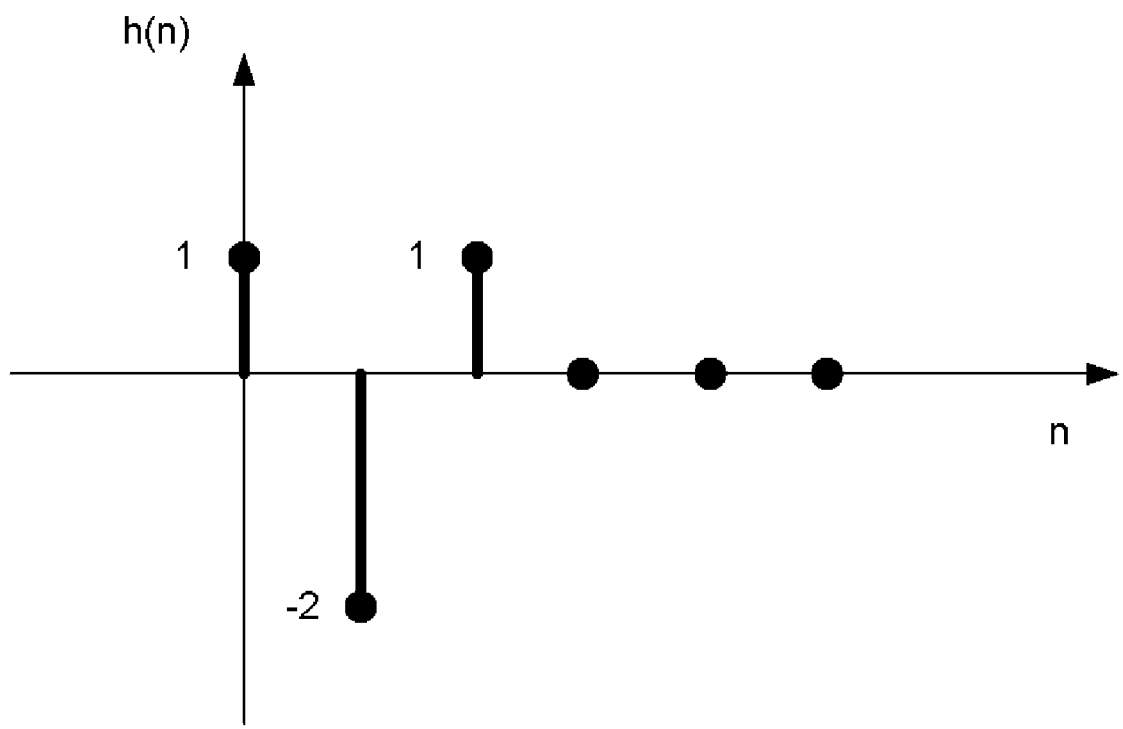
FIG. 6 provides a graph in the time domain where the impulse response of NTF is FIR and has only three non-zero points.

In the frequency domain all zeros of NTF are on X=1, Y=0 and all poles are located on origin (X=0, Y=0) as is shown in the graph provided in FIG. 5. In FIG. 6, in the time domain, the impulse response has only three non-zero points as shown.

Figure 7:
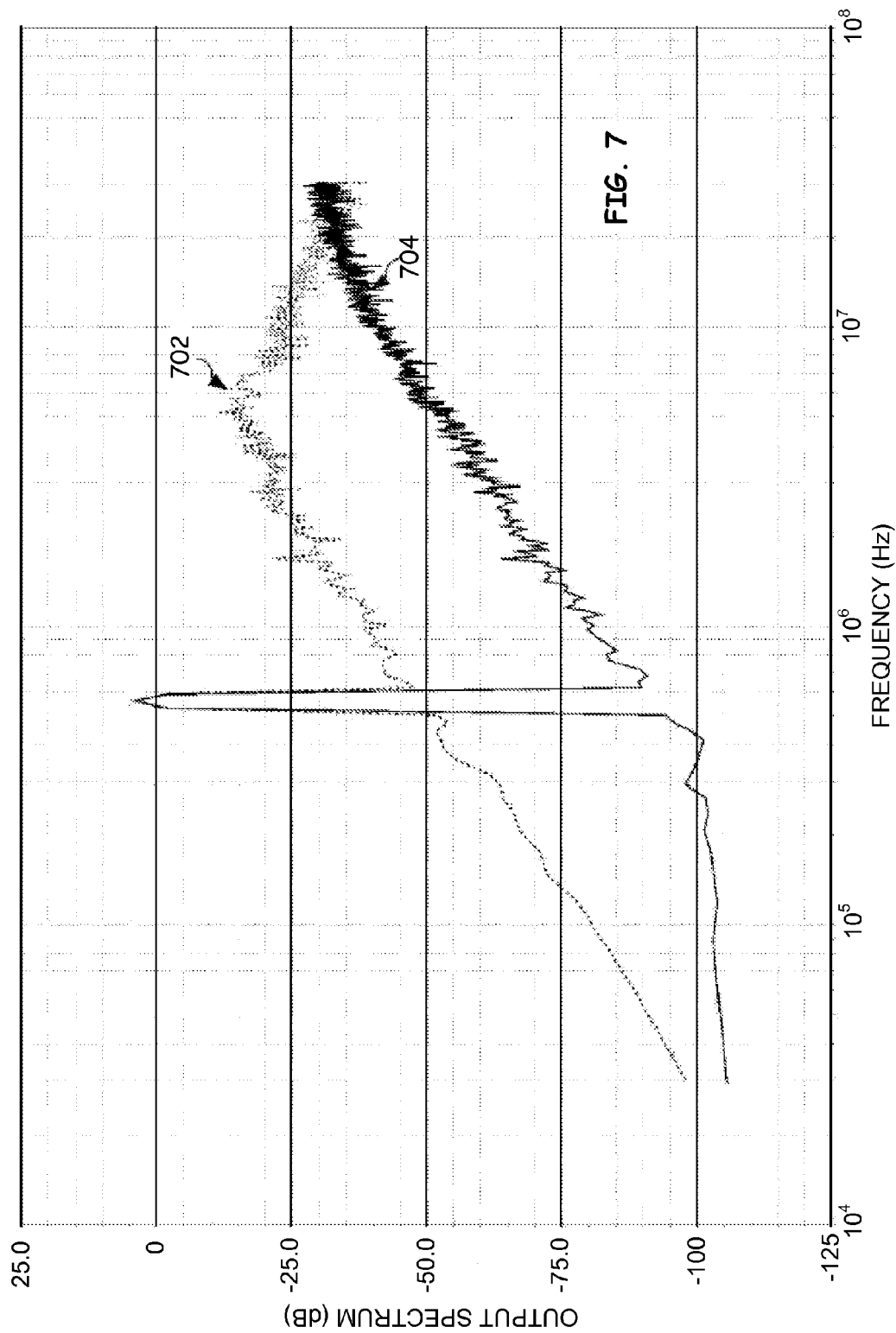
FIG. 7 depicts the results comparing the output spectrum of a conventional $\Sigma\Delta$ ADC with excess delay in its feedback loop to an output spectrum associated with a $\Sigma\Delta$ ADC provided by embodiments of the present invention.

FIG. 7 depicts the results comparing the output spectrum of a conventional ΣΔ ADC with excess delay in a feedback loop to an output spectrum associated with an embodiment of the present invention. Curve 702 shows an increase in quantization noise (low SNR) and a tendency for instability as evidenced by the peak. Curve 704 depicts an output spectrum produced by using a ΣΔ ADC provided by embodiments of the present invention. This curve shows a well-behaved quantization noise without instability issues.

Figure 8:
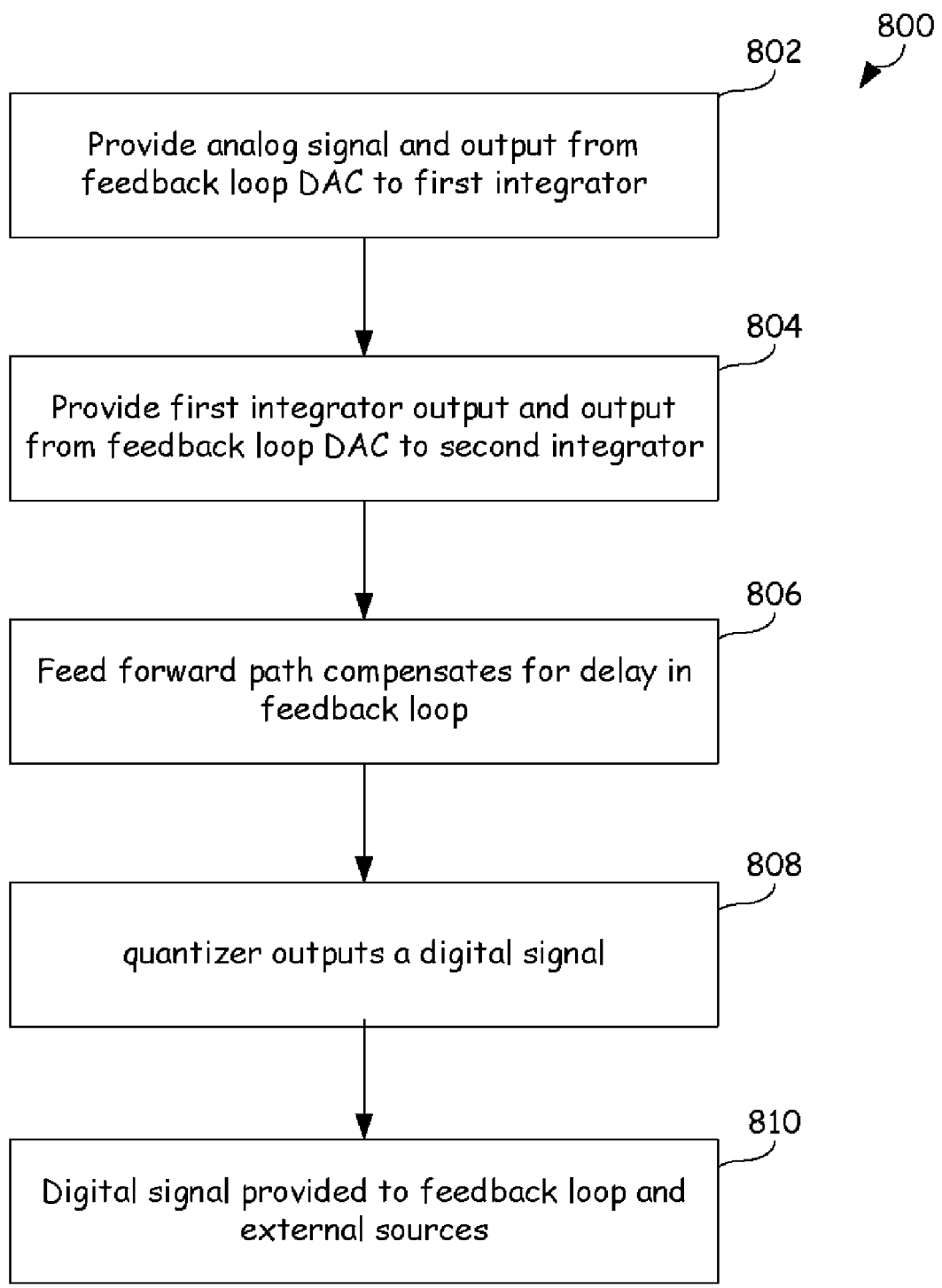
FIG. 8 depicts a logic flow diagram in accordance with embodiments of the present invention.

FIG. 8 depicts a logic flow diagram in accordance with embodiments of the present invention. This logic flow diagram describes the processes by which a ΣΔ ARC may compensate for delay in the feedback loop. Operations 800 begin with Step 802, wherein an analog signal and the output of a first DAC located within the feedback loop are combined such that their difference is provided as an input to the first stage integrator. In Step 804 the output of the first stage integrator is combined with the output of a second DAC wherein their difference is supplied as the input to the second integrator. A feed-forward path associated with the second integrator compensates for time delay introduced in the feedback loop in step 806. The time delay allows digital processing to be performed in order to better quantize in order to improve the SNR of the signal. However, at the same time this time delay introduces potential instability which is addressed By the zero introduced in Step 806 by the feed-forward path. In Step 808 the output of the second integrator is combined with the output of the feed-forward path. This combined output serves as the input to the quantizer. The quantizer outputs a digital signal in Step 808. The signal may be externally sampled in step 810 and used by the feedback loop having delay circuitry in step 812. This feedback loop will involve some digital processing to improve the SNR. This digital processing takes time where this time is the time allowed for the by the delay circuitry within the feedback loop. These outputs are then used by DAC to provide inputs to the first and second integrators.

In summary, the present invention provides a ΣΔ ADC that compensates for the adverse effects associated with the time delay introduced by delay circuitry of the feedback loop. This ΣΔ ADC includes a first summing stage, first integrator, second summing stage, second integrator, quantizer, and feedback loop. The second integrator has associated with it a feed forward pass operable to reduce adverse effects of delay circuitry within the feed back loop. Feedback loop includes delay circuitry and a number of digital to analog converters. The feed forward pass that reduces the effects of the delay circuitry may be the addition of a resistance within the second or additional integrator. The time delays associated with the delay circuitry may lead to circuit instability or meta-stability to be reduced or eliminated.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

Although the present invention is described in detail, it should be understood that various changes, substitutions and alterations can be made hereto without departing from the spirit and scope of the invention as described by the appended claims.

What is claimed is:

1. A sigma delta (ΣΔ) analog to digital converter (ADC), comprising:
    a first summing stage operable to receive an analog signal;
    a first integrator;
    at least one additional summing stage operable to receive an output from the first integrator;
    at least one additional integrator having a fed forward path, the feed forward path operable to reduce effects of delay circuitry within a feedback loop;
    a quantizer; and
    the feedback loop comprising:
        the delay circuitry, wherein the delay circuitry produces a time delay during which digital processing occurs; and
        a plurality of digital to analog converters (DACs) operable to provide digital feedback signals to the summing stages.

2. The ΣΔ ADC of claim 1, wherein the feed forward path comprises a resistance within the at least one additional integrator.

3. The ΣΔ ADC of claim 2, wherein the resistance and a capacitance in the feed forward loop establish a time constant associated with the feed forward loop.

4. The ΣΔ ADC of claim 1, wherein the delay circuitry comprises a latch.

5. The ΣΔ ADC of claim 1, wherein the delay circuitry provides a fixed delay, and wherein this fixed delay is less than or equal to one clock period.

6. The ΣΔ ADC of claim 5, wherein this fixed delay is ½ clock period.

7. A method to compensate for a time delay within a feedback loop of a sigma delta (ΣΔ) analog to digital converter (ADC), the method comprising:
   receiving an analog signal and a first digital feedback signal;
   providing a difference between the analog signal and the first digital feedback signal to a first integrator;
   producing an output signal with the first integrator;
   providing a difference between the output signal of the first integrator and a second digital feedback signal to a second integrator;
   producing an output signal with the second integrator;
   feeding forward a zero to compensate for timing delays in the feedback loop that produces the first digital feedback signal and second digital feedback signal;
   producing a digital output signal based on the output signal of the second integrator and the fed forward zero; and
   producing the first digital feedback signal and second digital feedback signal based on the digital output signal.

8. The method of claim 7, wherein the feed forward path comprises a resistance within the second integrator.

9. The method of claim 8, wherein the resistance and a capacitance in the feed forward loop establish a time constant associated with the feed forward loop.

10. The method of claim 7, where in the timing delay is produced with a latch.

11. The method of claim 7, wherein the timing delay comprises a fixed delay, and wherein this fixed delay is less than or equal to one clock period.

12. The method of claim 11, wherein this fixed delay is ½ clock period.

13. A sigma delta (ΣΔ) analog to digital converter (ADC), comprising:
   a first summing stage operable to receive an analog signal;
   a first integrator;
   a second summing stage operable to receive an output from the first integrator;
   a second integrator having a feed forward path, the feed forward path operable to reduce effects of delay circuitry within a feedback loop;
   a quantizer; and
   the feedback loop comprising:
      the delay circuitry, wherein the delay circuitry produces a time delay during which digital processing occurs; and
      a plurality of digital to analog converters (DACs) operable to provide digital feedback signals to the summing stages.

14. The ΣΔ ADC of claim 13, wherein the feed forward path comprises a resistance within the at least one additional integrator.

15. The ΣΔ ADC of claim 14, wherein the resistance and a capacitance in the feed forward loop establish a time constant associated with the feed forward loop.

16. The ΣΔ ADC of claim 13, wherein the delay circuitry comprises a latch.

17. The ΣΔ ADC of claim 13, wherein the delay circuitry provides a fixed delay, and wherein this fixed delay is less than or equal to one clock period.

18. The ΣΔ ADC of claim 17, wherein this fixed delay is ½ clock period.

* * * * *